United States Patent [19]

Mizrah

[11] 4,199,379
[45] Apr. 22, 1980

[54] METHOD FOR PRODUCING METAL PATTERNS ON SILICON WAFERS FOR THERMOMIGRATION

[75] Inventor: Tiberiu Mizrah, Baden, Switzerland

[73] Assignee: BBC Brown Boveri & Company, Limited, Baden, Switzerland

[21] Appl. No.: 942,794

[22] Filed: Sep. 15, 1978

[30] Foreign Application Priority Data

Dec. 15, 1977 [CH] Switzerland ............... 15443/77

[51] Int. Cl.² .................................................. H01L 21/225
[52] U.S. Cl. ......................................... 148/1.5; 148/171; 148/178; 148/188; 156/659.1; 156/660
[58] Field of Search .............. 148/1.5, 171, 188, 178; 156/659, 660

[56] References Cited

U.S. PATENT DOCUMENTS

| | | | |
|---|---|---|---|
| 2,813,048 | 11/1957 | Pfann | 75/65 ZM |
| 3,269,861 | 8/1966 | Schneble et al. | 156/660 X |
| 3,806,361 | 4/1974 | Lehner | 148/188 X |
| 3,901,736 | 8/1975 | Anthony et al. | 148/1.5 |
| 3,998,662 | 12/1976 | Anthony et al. | 148/1.5 |
| 4,012,236 | 3/1977 | Anthony et al. | 148/1.5 |
| 4,040,878 | 8/1977 | Rowe | 148/1.5 X |

*Primary Examiner*—G. Ozaki
*Attorney, Agent, or Firm*—Oblon, Fisher, Spivak, McClelland & Maier

[57] ABSTRACT

A method of producing metal patterns on silicon wafers prior to a thermomigration process, including covering the surface of a wafer completely with a metal film, producing a photoresist pattern on portions of the metal film corresponding to a predetermined thermomigration pattern, etching away the uncovered portions of the metal film, removing the photoresist film, and annealing the remaining metal film pattern.

4 Claims, 3 Drawing Figures

METHOD FOR PRODUCING METAL PATTERNS ON SILICON WAFERS FOR THERMOMIGRATION

BACKGROUND OF THE INVENTION

1. Field of the Invention:

This invention relates to a method of producing metal patterns on a silicon wafer prior to the thermomigration of the metal into the wafer.

2. Description of the Prior Art:

Methods for the production of metal patterns on silicon wafers for thermomigration thereof into the wafer are known for example from U.S. Pat. No. 3,901,736 and DT-OS No. 26 52 667. An essential feature of the known methods is that the migrating metal, whether in the form of points or lines, must first be supported laterally on the wafer. This lateral support is produced either by applying the metal in depressions previously etched in the silicon wafer (U.S. Pat. No. 3,901,736) or by enclosing the metal pattern laterally with an insulating film (e.g. of silicon oxide or silicon nitride) (DT-OS No. 26 52 667). These known methods consequently require a relatively large number of process steps which precede the actual thermomigration.

SUMMARY OF THE INVENTION

Accordingly, one object of this invention is to provide a method of the type mentioned in which the number of process steps before the actual thermomigration is small and in which neither the application of an insulating film nor the etching of a depression is necessary.

This and other objects are achieved according to the invention by first applying a 5 to 100 μm thick metal film to the surface of the silicon wafer, applying to this metal layer a photoresist film corresponding to the pattern, then etching away the areas of the metal layer not covered by the photoresist film, removing the photoresist film, and subjecting the remaining metal layer to an annealing process.

It has proved to be particularly advantageous to produce the photoresist film by means of photolithography or a screen press method.

The above-mentioned annealing process is preferably carried out in an inert gas atmosphere at a temperature of 560° to 570° C. for about 30 minutes.

Aluminum is especially suited to be the migrating metal.

BRIEF DESCRIPTION OF THE DRAWINGS

A more complete appreciation of the invention and many of the attendant advantages thereof will be readily obtained as the same becomes better understood by reference to the following detailed description when considered in connection with the accompanying drawings, wherein.

DETAILED DESCRIPTION OF THE PREFERRED EMBODIMENTS

Figure 1:
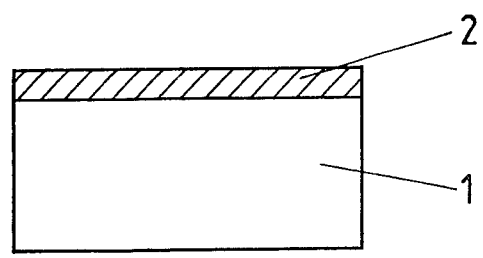
FIG. 1 is a schematical representation of a silicon wafer having a metal film layer formed thereon.

Referring now to the drawings, wherein like reference numerals designate identical or corresponding parts throughout the several views and more particularly to FIG. 1 thereof, the steps of the method of the invention are now described. After cleaning of a single-crystal silicon wafer 1 an aluminum film 2 of approximately 17 μm thickness is evaporated onto the surface of this silicon wafer. Preferably the silicon wafer 1 is so cut that the surface plane lies in the (111)-crystal plane.

Figure 2:
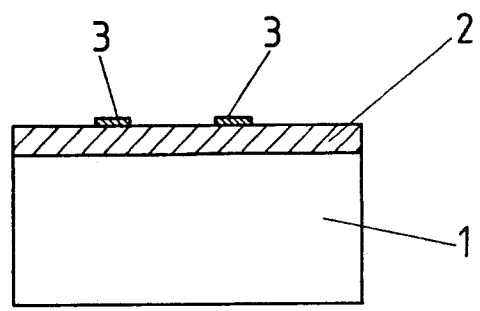
FIG. 2 is a schematical representation of the metalized silicon wafer of FIG. 1 with a photoresisted pattern formed thereon.

Next a photoresist film is applied over the aluminum layer 2 and the desired pattern produced for example by means of a screen press method on the photoresist film, so that photolacquer remains only at the places 3 where there is to be aluminum for thermomigration as shown in FIG. 2.

Figure 3:
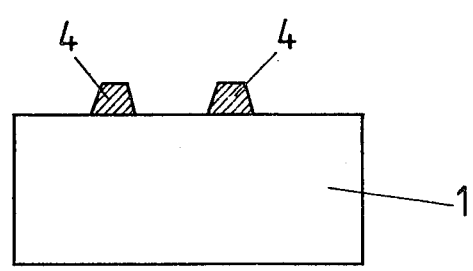
FIG. 3 is a schematic representation of a silicon wafer with a metal pattern formed thereon.

Thereafter, the aluminum layer 2, where it is not covered by the photoresist film 3, is etched away for example with an acid consisting of $H_3PO_4:HNO_3:H_2O$ in the proportion 20:1:4 at a temperature of 60° to 65° C. Thereafter, the photoresist film 3 removed, as shown in FIG. 3.

There then follows annealing of the wafer, which is done preferably in an inert gas atmosphere (e.g. nitrogen) at a temperature between 560° and 570° C. for a period of about 30 minutes. By this annealing just below the eutectic point of the aluminum/silicon system, the alloying of the aluminum into the silicon wafer at the beginning of the actual thermomigration is made easier. Further, a vertical directional effect is thereby produced, since the aluminum alloys into the silicon mainly through the previously sintered boundary layer, and does not spread laterally. Thus the former lateral guiding of the aluminum by an etched depression or an insulating film is thereby rendered superfluous.

After this pretreatment the actual thermomigration can then take place in the usual manner.

Obviously, numerous modifications and variations of the present invention are possible in light of the above teachings. It is therefore to be understood that within the scope of the appended claims, the invention may be practiced otherwise than as specifically described herein.

What is claimed as new and desired to be secured by Letters Patent of the United States is:

1. A method for producing an aluminum metal pattern on a surface of a silicon wafer for subsequent thermomigration of said aluminum pattern into said wafer, comprising:

applying to said surface of said silicon wafer an aluminum layer having a thickness in the range of from about 5 micrometers to about 100 micrometers;

applying to said aluminum layer a photoresist film covering said aluminum layer at those surface portions thereof where said aluminum metal pattern is to be produced;

etching away said aluminum layer in those surface portions thereof that are not covered by said photoresist film;

removing said photoresist film;

annealing said silicon wafer with said aluminum layer thereon in those surface portions thereof covered by said photoresist film during said etching, said annealing being effected below an eutectic point of a system consisting of said aluminum and said silicon for a period of about 30 minutes at a temperature in the range of from 560° to 570° C. in an inert gas atmosphere to form a sintered boundary layer between said silicon wafer and said aluminum metal pattern thereon.

2. A method according to claim 1 wherein said step of producing said photoresist layer comprises:
   a photolithographic step.

3. A method according to claim 1, wherein said step of producing said photoresist layer comprises: forming said pattern using a screen press.

4. A method according to claim 1, wherein said silicon wafer exhibits a surface plane which is the (111)-plane.

* * * * *